(12) United States Patent
Stringer et al.

(10) Patent No.: US 9,392,725 B2
(45) Date of Patent: Jul. 12, 2016

(54) ELECTRONICS CHASSIS ADAPTABLE FOR FORCED AIR OR LIQUID CONDUCTION COOLING

(71) Applicant: LOCKHEED MARTIN CORPORATION, Bethesda, MD (US)

(72) Inventors: Andrew O. Stringer, Apopka, FL (US); Bryan Christopher Baraclough, Kissimmee, FL (US); Scott Edwin Hinnershitz, Oviedo, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 245 days.

(21) Appl. No.: 14/153,583

(22) Filed: Jan. 13, 2014

(65) Prior Publication Data

US 2015/0201527 A1    Jul. 16, 2015

(51) Int. Cl.
*H05K 7/20* (2006.01)

(52) U.S. Cl.
CPC ........ *H05K 7/20009* (2013.01); *H05K 7/20136* (2013.01); *H05K 7/20218* (2013.01); *H05K 7/20254* (2013.01)

(58) Field of Classification Search
CPC .......... H05K 7/20263; H05K 7/20009; H05K 7/20254; H05K 7/20218; H05K 7/20136
USPC .......................... 165/80.1–80.4, 104.33, 80.3; 361/679.46–679.54, 688–723; 174/547–548
See application file for complete search history.

(56) References Cited

U.S. PATENT DOCUMENTS

| | | | |
|---|---|---|---|
| 4,366,526 A * | 12/1982 | Lijoi | H05K 7/20672 174/15.2 |
| 4,536,824 A | 8/1985 | Barrett et al. | |
| 7,324,336 B2 | 1/2008 | Vos et al. | |
| 7,508,670 B1 | 3/2009 | Thorson et al. | |
| 7,957,132 B2 * | 6/2011 | Fried | H05K 7/20809 165/185 |
| 7,995,346 B2 | 8/2011 | Biemer et al. | |
| 8,223,494 B2 | 7/2012 | Bult | |
| 8,467,188 B2 * | 6/2013 | Hsieh | H05K 7/20927 174/548 |
| 2007/0297136 A1* | 12/2007 | Konshak | H05K 7/20772 361/699 |
| 2009/0147472 A1 | 6/2009 | Mantych et al. | |
| 2010/0053901 A1* | 3/2010 | Irving | H05K 7/20545 361/707 |
| 2011/0141692 A1 | 6/2011 | Bult | |
| 2013/0128459 A1* | 5/2013 | Pautsch | H05K 7/20727 361/696 |
| 2015/0156926 A1* | 6/2015 | Levesque | H05K 7/20745 361/679.47 |

* cited by examiner

*Primary Examiner* — Jerry Wu
*Assistant Examiner* — Stephen Sul
(74) *Attorney, Agent, or Firm* — Terry M. Sanks, Esq.; Beusse Wolter Sanks & Maire, PLLC

(57) ABSTRACT

An electronics chassis comprises a frame including at least one fluid flow path along a side of the frame and that is sealed relative to an interior volume of the frame. A first opening to the fluid flow path is at a first end of the frame; and, a second opening to the fluid flow path at a second end of the frame. The first and second ends of the frame are configured to interchangeably receive components for forced air conduction cooling and components for liquid conduction cooling through the fluid flow paths.

15 Claims, 9 Drawing Sheets

ELECTRONICS CHASSIS ADAPTABLE FOR FORCED AIR OR LIQUID CONDUCTION COOLING

BACKGROUND

Embodiments generally relate to heat dissipation for electrical circuits or circuit modules. More particularly, embodiments relate to housings or chasses in which such electrical components are mounted and the chasses are adapted for circulation of fluid there through to dissipate heat generated by the operating electrical circuits or circuit modules.

In various applications, such as in land vehicles, airplanes and helicopters, computer components, such as electrical circuit modules, printed circuit boards (PCB) or integrated circuit boards, are mounted within a housing known as a chassis. Heat generated by these components must be dissipated otherwise high operating temperatures over a length of time may have a deleterious effect on the components. Host platforms utilizing an open architecture processor typically incorporate one of two methods for controlling temperature or dissipating heat, depending on the environment in which the processor is operating. One known method is forced air conduction cooling in which a fan or blower is used to force air through channels in the chassis walls, or air flows directly over or across the components to control operating temperatures. Another method is known as liquid conduction cooling. In this method a pressurized coolant flows through one or more conduits associated with the chassis to dissipate heat.

As noted above, an application or system in which the chassis is operating is usually configured to function in one of these two conduction cooling modes. By way of example, an organization such as a military or law enforcement organization maintains a fleet of vehicles or multiple different fleets of different vehicles. At times when a chassis must be replaced in a vehicle a new chassis that is configured for the particular conduction cooling mode associated with that vehicle must be used. If no such chassis is available then that vehicle cannot be operated until the proper chassis is obtained. The absence of an appropriate chassis translates into "down" time for that vehicle, which can disrupt operations of the organization. A chassis has not been developed nor is one available that is adaptable to be used in either a forced air conduction cooling mode or in a liquid conduction cooling mode.

SUMMARY

Embodiments relate to a housing that comprises a frame including at least one fluid flow path along a side of the frame and that is sealed relative to an interior volume of the frame. A first opening to the fluid flow path is at a first end of the frame; and, a second opening to the fluid flow path at a second end of the frame. The first and second ends of the frame are configured to interchangeably receive components for forced air conduction cooling and components for liquid conduction cooling through the fluid flow path.

Embodiments also relate to a modular electronics chassis that comprise a frame including a first fluid flow path along a first side wall and a second fluid flow path along a second side wall that is parallel to the first side wall. The first and second fluid flow paths are sealed relative to an interior volume of the frame. A first opening of the first fluid flow path is provided at a first end of the frame and a second opening of the first fluid flow path is provided at a second end of the frame. In addition, a first opening of the second fluid flow path is provided at the first end of the frame and a second opening of the second fluid flow path is provided at the second end of the frame. The first and second ends of the frame are adaptable to interchangeably receive components for forced air conduction cooling, and components for liquid conduction cooling, through the first and second fluid flow paths.

Still other embodiments relate to a kit for a modular chassis that is adapted to receive components for liquid conduction cooling and components for forced air cooling. The kit may comprise one or more first fluid control couplings detachably mountable on a first end of an electronics chassis at a first opening to a fluid flow path in a frame of the chassis to control fluid flow into or out of the fluid flow path when the chassis functions in a liquid conduction cooling mode. In addition, the kit may comprise one or more second fluid control couplings detachably mountable on a second end of the electronics chassis at a second opening to the fluid flow path in the frame of the chassis to control fluid flow into or out of the fluid flow path when the chassis functions in a liquid conduction cooling mode. The kit may also comprise a fan assembly detachably mountable on the first end or second end of the frame of the chassis when the chassis functions in a forced air conduction cooling mode.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
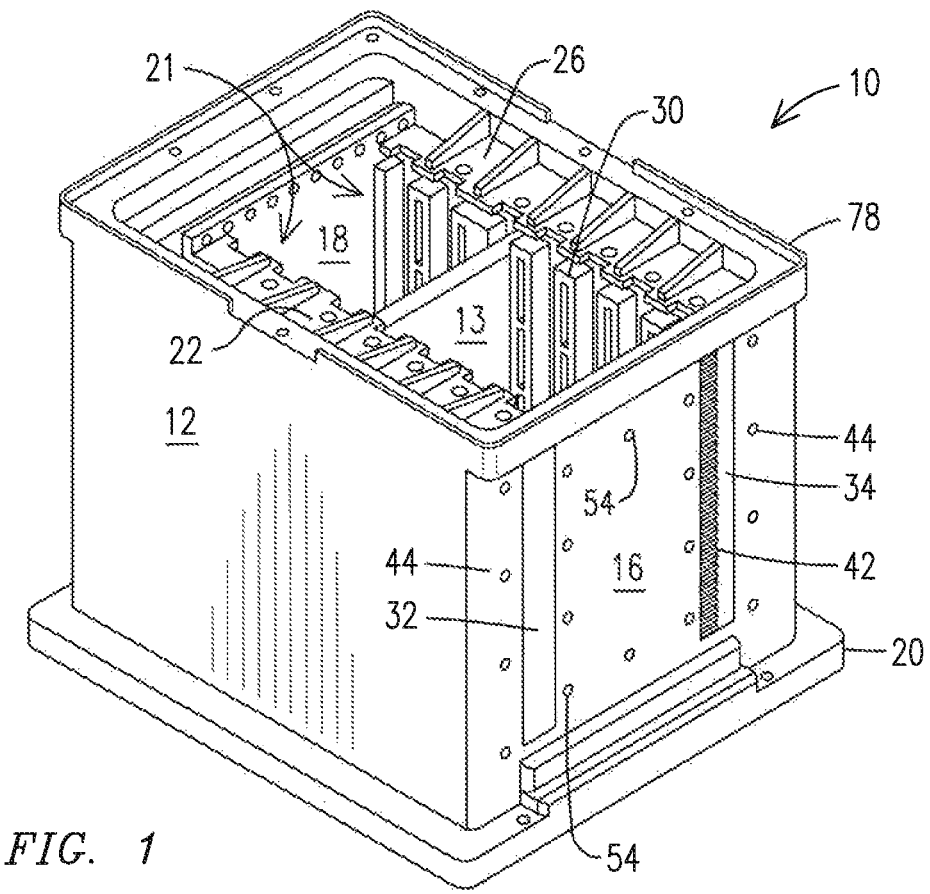
FIG. 1 depicts a perspective view of a first end of an electronics chassis in accordance with aspects of an embodiment.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments. In addition, while the below described embodiments refer to first and second fluid flow paths, at least with respect to liquid conduction cooling wherein there is fluid flow communication between first and second fluid flow paths, such fluid flow may be characterized as following a single or one or more fluid flow paths. To that end, embodiments of forced air conduction cooling and liquid conduction cooling may include a single or one or more fluid flow paths.

FIGS. 1-4 illustrate an electronics conduction cooled chassis 10 that is adaptable to function with either forced air conduction cooling components or liquid conduction cooling components. The chassis 10 may include two fluid flow paths each sealed relative to an interior of the chassis 10 and each disposed along a respective side of the chassis for conduction of a cooling fluid such as air or a liquid coolant, to cool electronic components in the chassis. Embodiments may include a single fluid flow path along a side of the chassis 10. In an embodiment, the chassis 10 may include two spaced part side walls 12, 14 that are both operatively connected to a first end wall 16 and to a second end wall 18 that is opposite and distal to the first end wall 16. Both side walls 12, 14 and both end walls 16, 18 are supported on a base 20.

Figure 7:
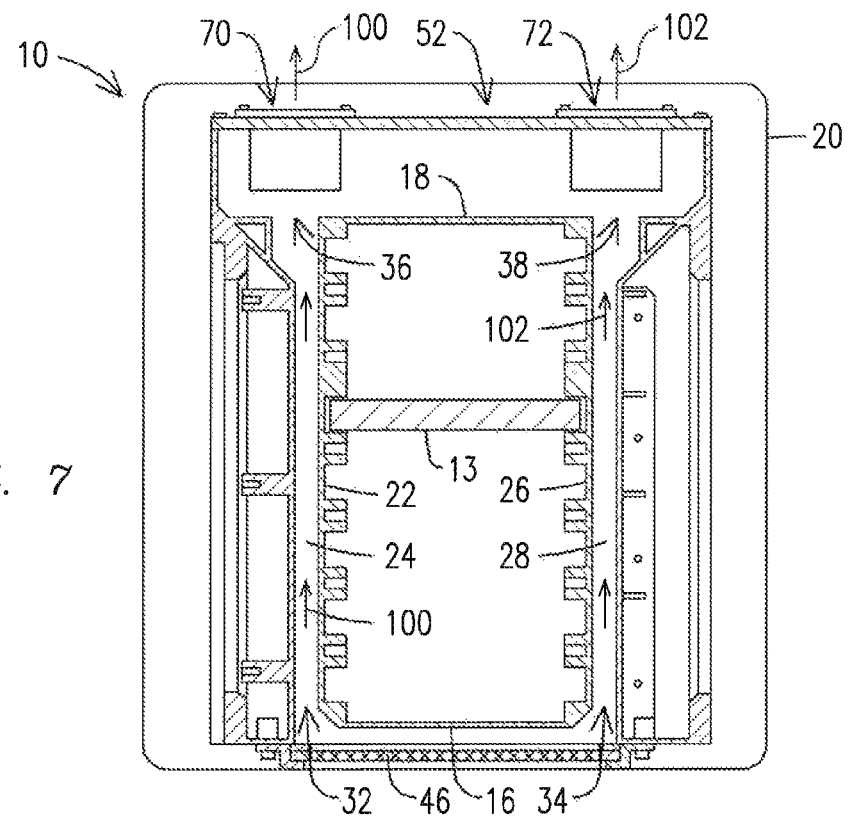
FIG. 7 is a top sectional view of the chassis taken along line 7-7 of FIG. 6A.
Figure 13:
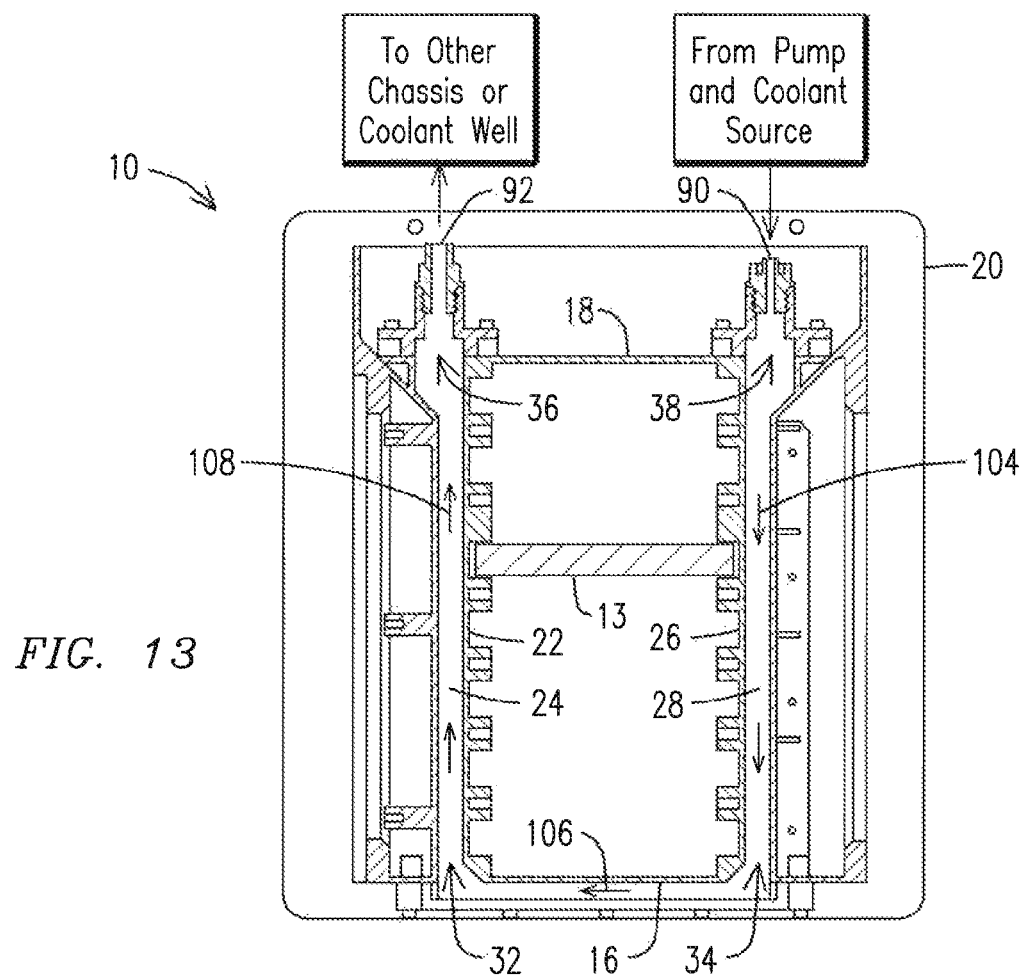
FIG. 13 depicts a top section view of the chassis taken along line 13-13 of FIG. 9A.

The chassis 10 may also include a rail assembly 21 for supporting one or more electronic circuit modules 13. The rail assembly 21 may include a first rail member 22 along the first side wall 12 and spaced from the side wall 12 forming a first fluid flow path 24, as shown in FIGS. 7 and 13. The rail assembly 21 also includes a second rail member 26 along the second side wall 14 and is spaced apart from the second side wall 14 forming a second fluid flow path 28, as shown in FIGS. 7 and 13. Each rail member 22, 26 may include a plurality of spaced apart rails 30 which define mounting locations for the one or more electronic circuit modules 13. As further illustrated in FIGS. 7 and 13, each of the rail members 22, 26 is connected at their respective ends to the first and second end walls 16, 18 to seal the fluid flow paths 24, 28 relative to an interior of the chassis 10. In embodiments, the rail assembly 21 may include the rail members 22, 26, the first end wall 16 and the second end wall 18 formed as an integral unit and mounted within a chassis frame. In embodiments, the chassis 10 may have an open architecture configuration to receive electronic circuit modules from various different manufacturers or suppliers; and, in a non-limiting example the above-described chassis parts are composed of aluminum or an aluminum alloy.

Figure 2:
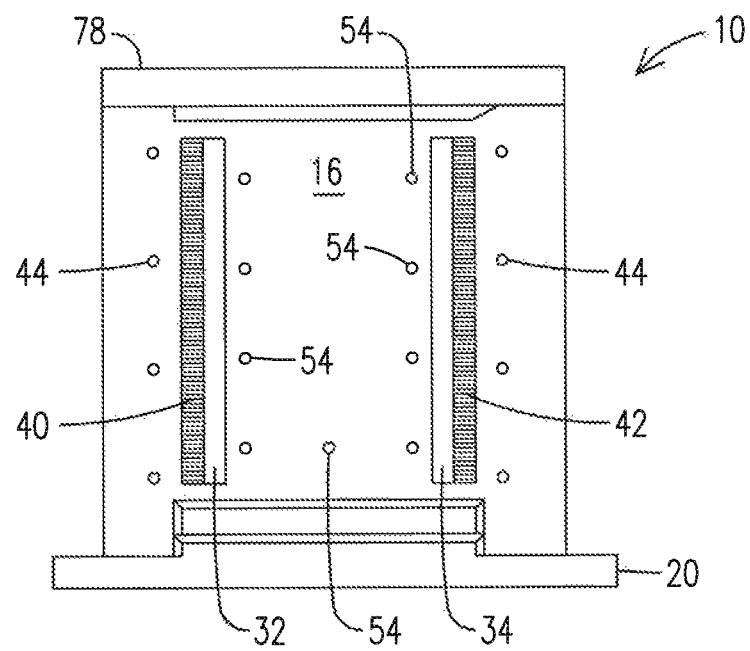
FIG. 2 depicts an elevational view of the first end of the chassis shown in FIG. 1.
Figure 3:
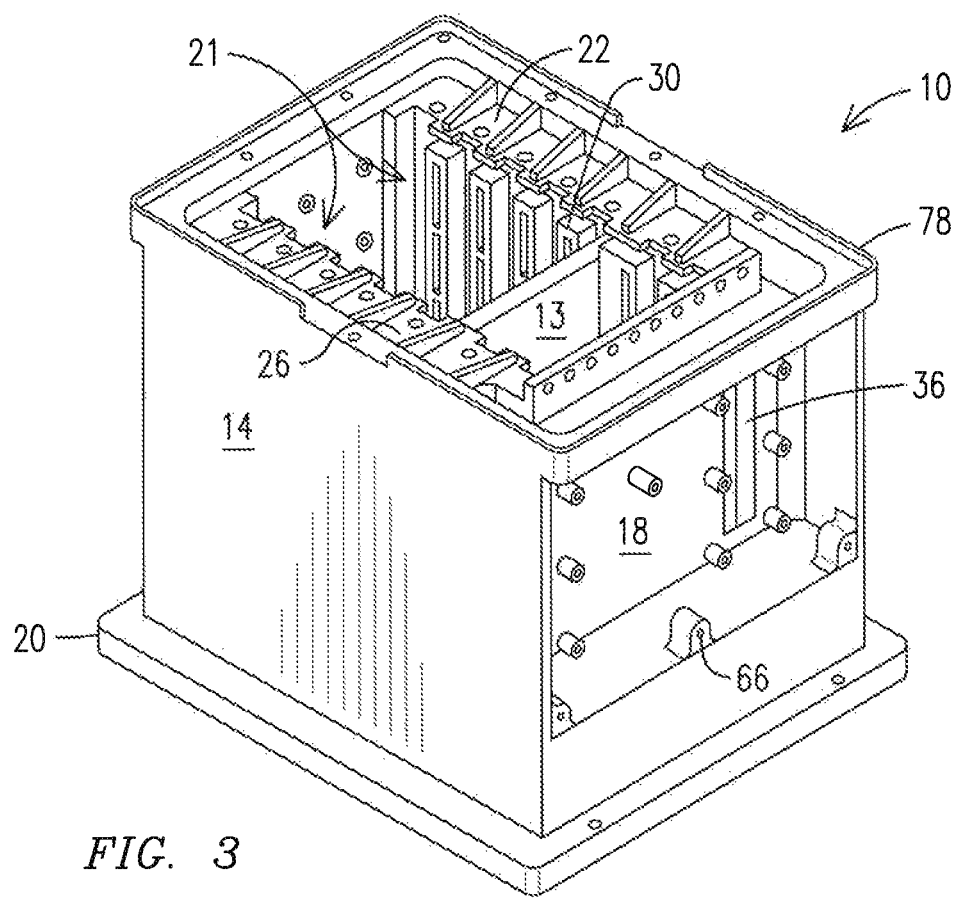
FIG. 3 depicts a perspective view of a second end of the electronics chassis of FIG. 1 in accordance with an aspect of an embodiment.
Figure 4:
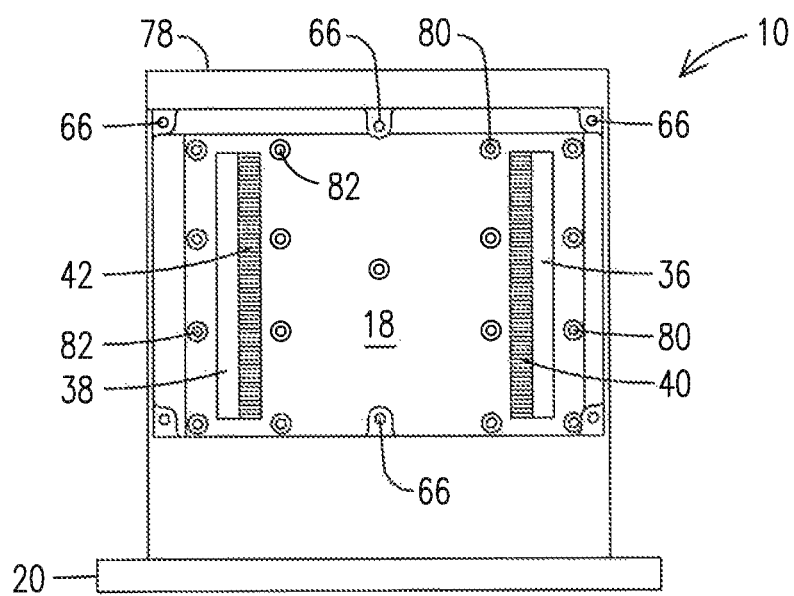
FIG. 4 depicts an elevational view of the second end of the chassis shown in FIG. 1 in accordance with an aspect of an embodiment.

With respect to FIGS. 2 and 4, the first end wall 16 includes a first pair of openings 32, 34 to the first and second flow paths 24, 28, respectively; and, the second end wall 18 includes a second pair of openings 36, 38 to the first and second fluid flow paths 24, 28, respectively. As further shown, a first finstock 40 is disposed within the first fluid flow path 24 and a second finstock 42 is disposed within the second fluid flow path 28. The finstocks 40, 42 may be composed of aluminum that is dipped or vacuum brazed so the finstocks 40, 42 are mounted (or fused) to the respective side walls 12, 14 and which adds to the structural integrity of the side walls 12, 14. In a non-limiting example, the finstocks 40, 42 may include spaced apart fins wherein the finstocks 40, 42 include ten fins per inch. Although the invention is not so limited, this spacing of fins minimizes drag on liquid flowing through the fluid flow paths 24, 28 when the chassis 10 is under liquid conduction cooling and minimizes collection of debris when the chassis 10 is under forced air conduction cooling. While the above described embodiments include finstocks, embodiments of the invention do not require the finstocks.

Figures 5A, 5B:
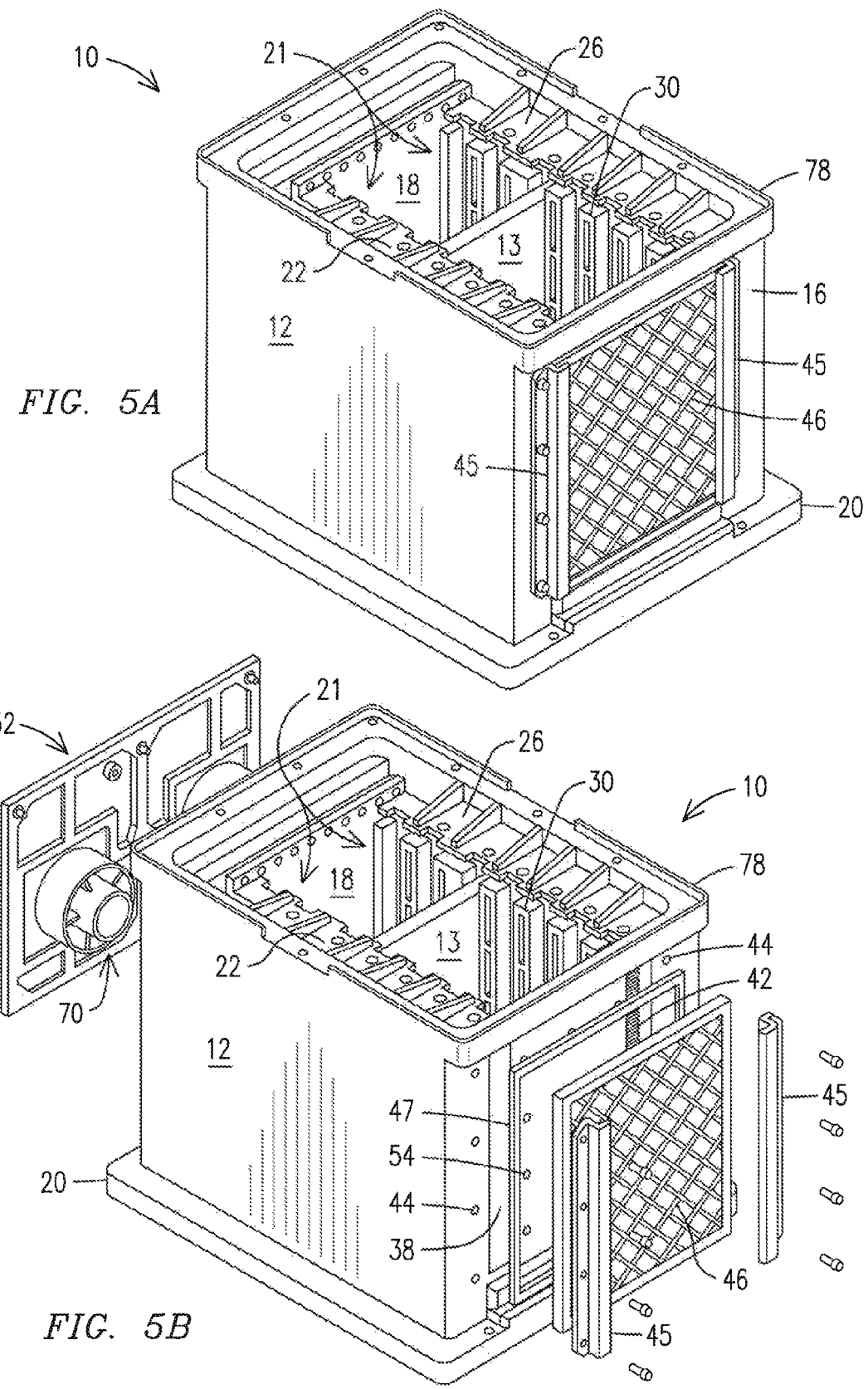
FIGS. 5A and 5B depict perspective views of the first end of the chassis with an air filter installed and an exploded view of the air filter installation, respectively.

As further shown in FIGS. 2 and 5B the first end wall 16 may include a first array of apertures 44 for attaching brackets 45 for mounting an air filter 46, with gasket 47, to the first end wall 16 using fasteners such as screws or bolts. A fan assembly 52 may be mounted to the second end wall 18 when the chassis 10 is under forced air conduction cooling. Although embodiments of the invention described herein include the air filter 46, when operating in a forced air conduction cooling mode a filter may not be required.

Figure 6A:
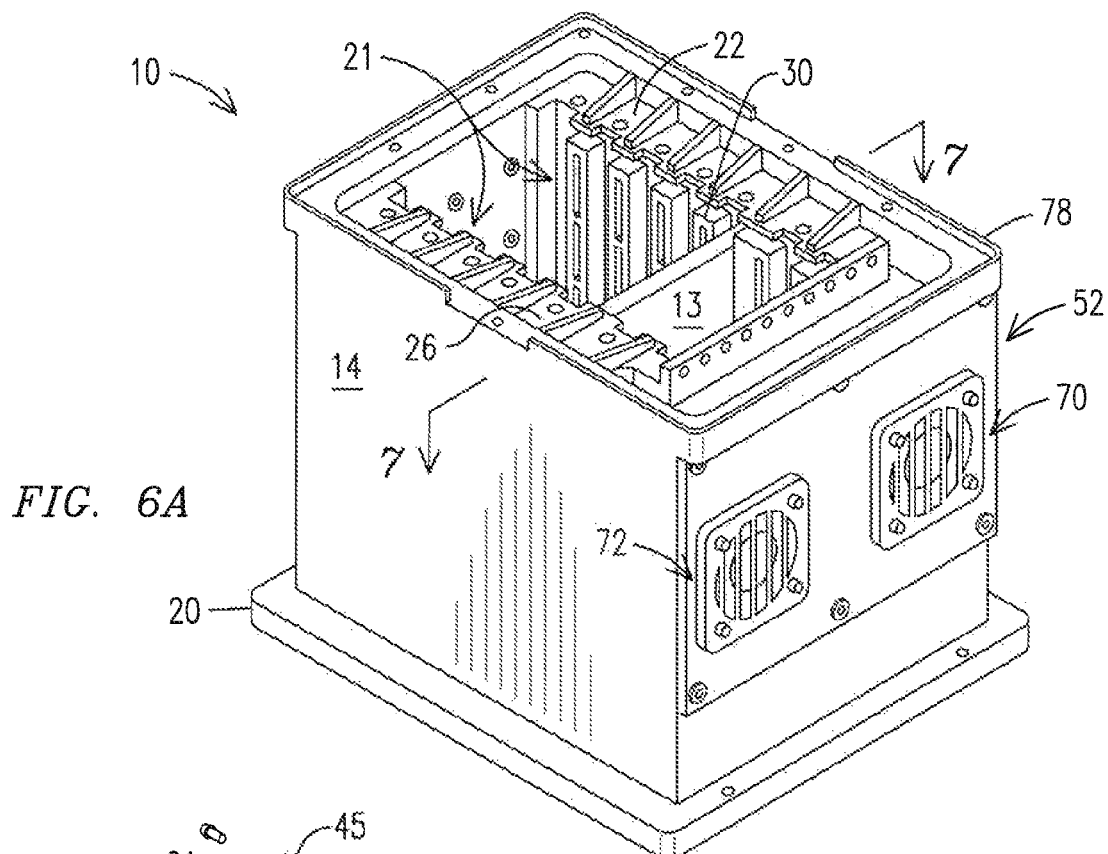
FIGS. 6A and 6B depict perspective views of the second end of the chassis with a fan assembly installed and an exploded view of the fan assembly installation, respectively.
Figure 6B:
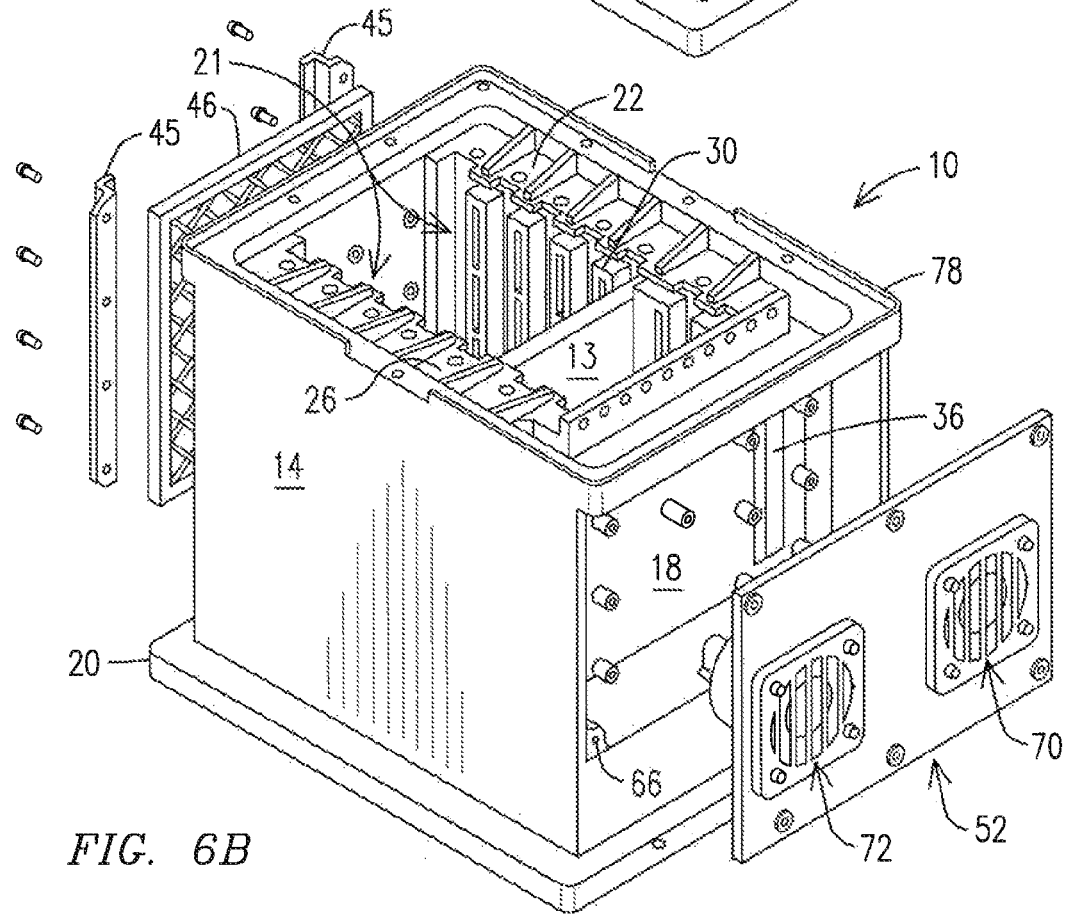
Figure 14:
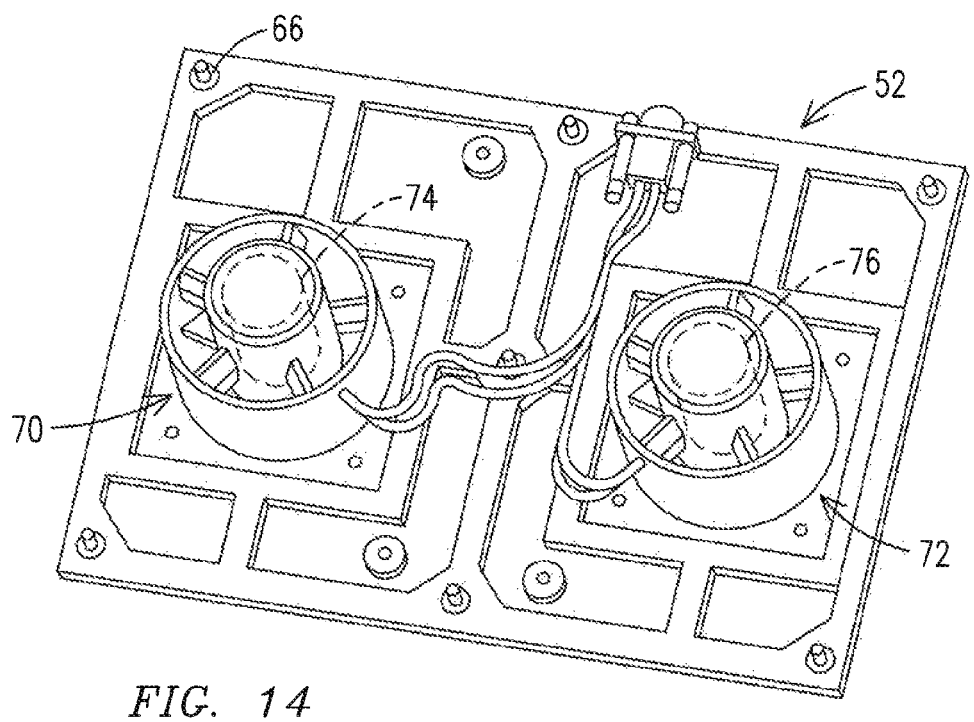
FIG. 14 depicts a perspective view of a backside of the fan assembly.

With respect to FIGS. 6A and 6B, a fan assembly 52 is mounted to the second end wall 18 for forced air conduction cooling to draw air through the first end wall 16 and first and second fluid flow paths 24, 28 for cooling. In a non-limiting example, the second end wall 18 is indented relative to the base 20 and a top rim 78 of the chassis 10 in order to receive the fan assembly 52. A plurality of apertures 66 form an array of apertures spaced apart on the base 20 and top rim 78 corresponding to an aperture array on the fan assembly 52 for receiving fasteners to mount the fan assembly 52 thereon for under forced air conduction cooling. The fan assembly 52 may include two fans 70, 72 each driven by a respective motor 74, 76 (FIG. 14). As shown in FIG. 7, The fans 70, 72 are positioned on the fan assembly 52 so they will be aligned with fluid flow paths 24, 28, respectively, to draw air through the air filter 46 and fluid flow paths 24, 28. Each fan motor 74, 76 is preferably encased within a motor housing to protect the motors 74, 76 from debris passing through the fans 70, 72. A non-limiting example of a fan assembly that may be used with an embodiment of the invention is a ½ Aximax fan manufactured by Ametek Rotron.

FIG. 7 illustrates the fluid flow path when the chassis 10 is operated under a forced air conduction cooling mode. More specifically, the fans 72, when activated draw air through the filter 46, openings 32, 34 and fluid flow paths 24, 28 as represented by arrows 100, 102. The air is exhausted through openings 36, 38 and fan assembly 52. This fluid flow of air dissipates heat generated by functioning electrical components, such as electric circuit modules 13, mounted in the chassis 10.

Figure 8A:
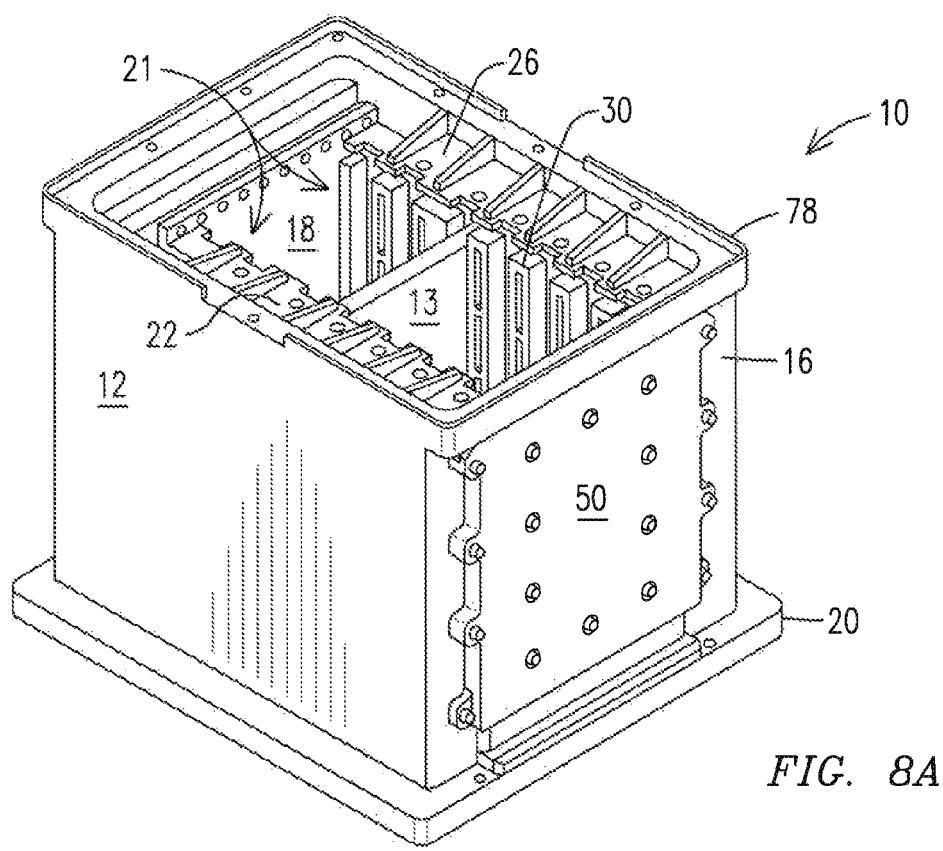
FIGS. 8A and 8B depict perspective views of the first end of the chassis with a seal plate installed and an exploded view of the seal plate installation, respectively.
Figure 8B:
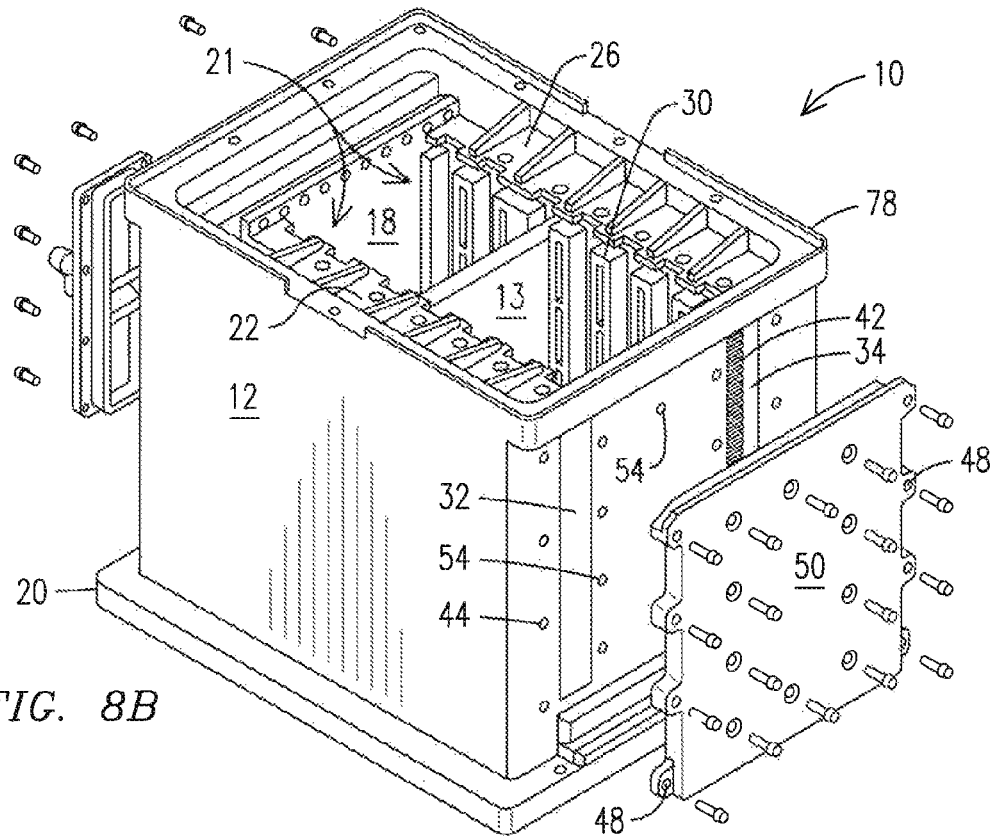

The first end wall 16 may also be configured to receive one or more fluid control couplings to seal the openings 32, 34 and control fluid flow into or out of the fluid flow paths 24, 28. In an embodiment, the hole pattern of the first array of apertures 44 also matches a perimeter hole pattern of apertures 48 on a seal plate 50 shown in FIGS. 8A, 8B and 12. In addition, the first end wall 16 may also include a second array of apertures 54 that may be arranged to match a hole pattern of an array of apertures or mounting bosses 56 (FIG. 12) on the seal plate 50, so that the seal plate 50 can be mounted to the first end wall 16, when the chassis 10 is under liquid conduction cooling.

Figure 12:
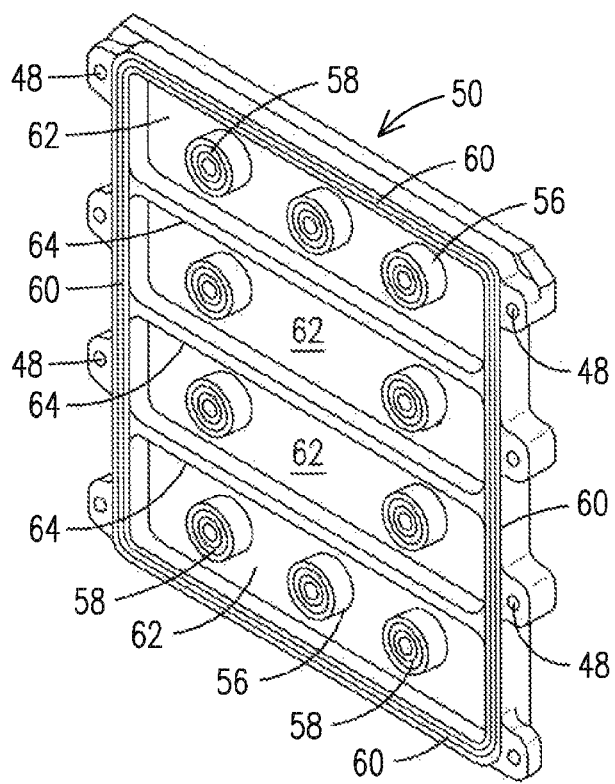
FIG. 12 depicts a perspective view of the seal plate shown in FIGS. 8A and 8B.

As further shown in FIG. 12, the mounting bosses 56 include O-rings 58 seated in circular grooves to seal the connection of the seal plate 50 to the chassis 10. In addition, a perimeter seal 60 is provided to further seal the connection of the seal plate 50 to the chassis 10. The seal plate 50 may also include a plurality of fluid flow channels 62 to provide fluid flow communication from the first fluid flow path 24 to the second fluid flow path 28, or vice versa, when liquid is injected into the first fluid flow path 24 and passes to the second fluid flow path 28, as will be explained below in more detail. Ribs 64 are disposed between the channels 62 and provide structural integrity or support to the plate 50 to minimize or prevent bowing of the plate 50 when liquid is flowing from the first fluid flow path 24 to the second fluid flow path 28, or vice versa. In a non-limiting example, a liquid coolant may be circulated in a closed-loop system at pressures of up to about 200 p.s.i.

Figure 9A:
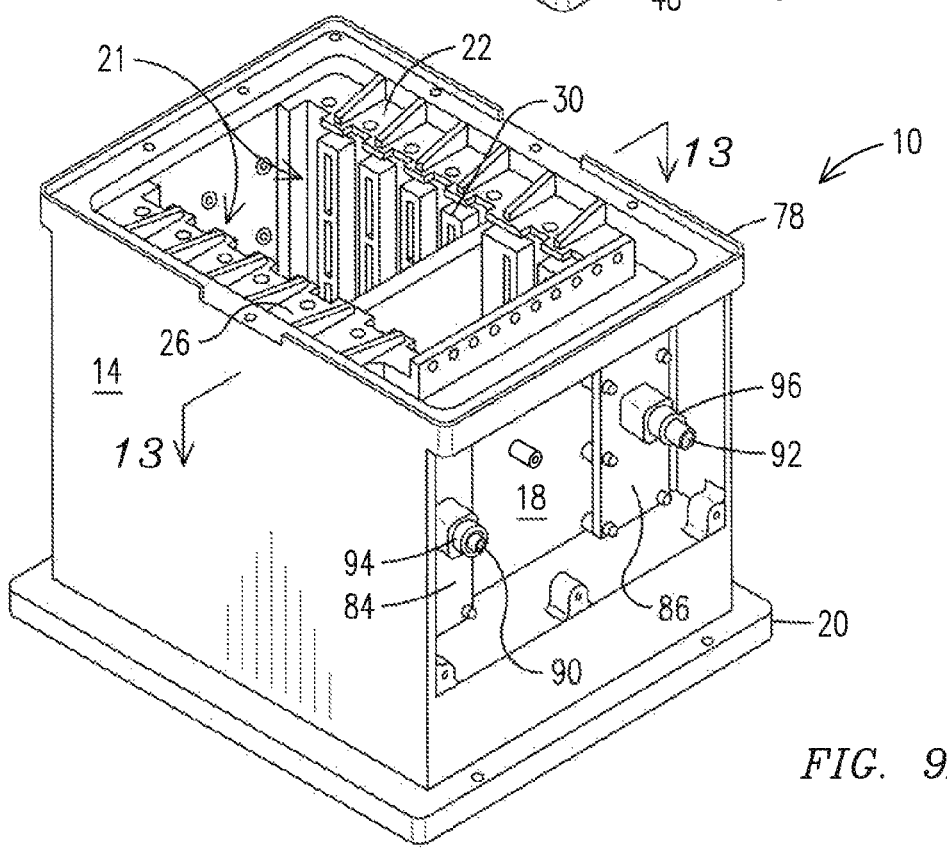
FIGS. 9A and 9B depict perspective views of the second end of the chassis including plates with liquid inlet and outlet ports installed and an exploded view of the plates installation, respectively.
Figure 9B:
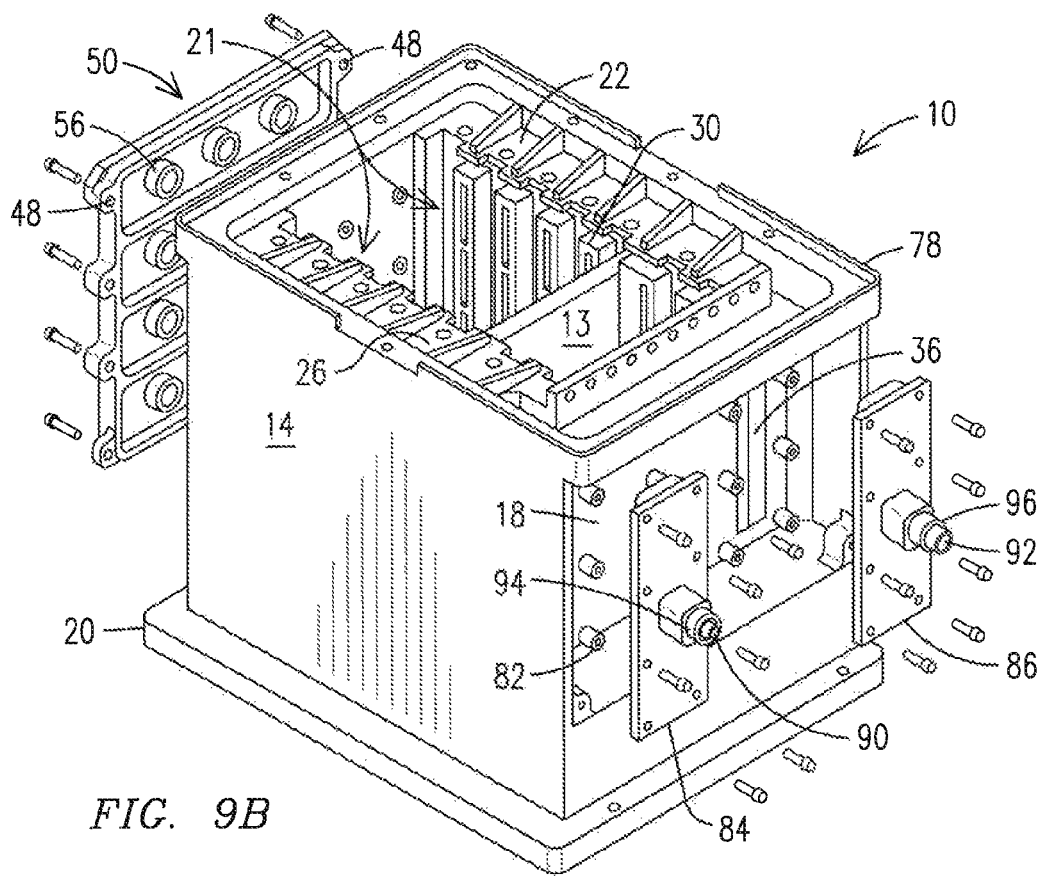

The second side wall 18, as shown in FIGS. 4, 9A and 9B, may also include a first set of apertures 80 surrounding the opening 36 to the first fluid flow path 24, and a second set of apertures 82 surrounding the opening 38 to the second fluid flow path 28. The apertures 80, 82 are provided for attaching fluid flow couplings such as mounting plates 84, 86 which may respectively include a fluid inlet port 90 and outlet port 90. Either plate 84, 86 can be mounted to the second end wall 18 at either opening 36, 38 so that a liquid coolant may be injected into the first or second fluid flow paths 24, 28 so that fluid flows from the first fluid flow path 24 to the second fluid flow path 28 or vice versa.

In a non-limiting example shown in FIG. 13, liquid coolant fluid flow path is represented by arrows 104, 106 and 108, which show liquid injected through inlet port 90, opening 38 and into the second fluid flow path 28. The coolant flows through opening 34, channels 62 on sealing plate 52, opening 32 and into the first fluid flow path 24. The coolant then exits the chassis 10 through opening 36 and outlet 92. Embodiments may have fluid lines controlling lines to other chassis connected in series or to a coolant well for recycling the coolant liquid. This fluid flow path of the liquid coolant dissipates heat generated by electronic components and/or electric circuit modules 13 functioning in the chassis 10.

Figures 10A, 10B:
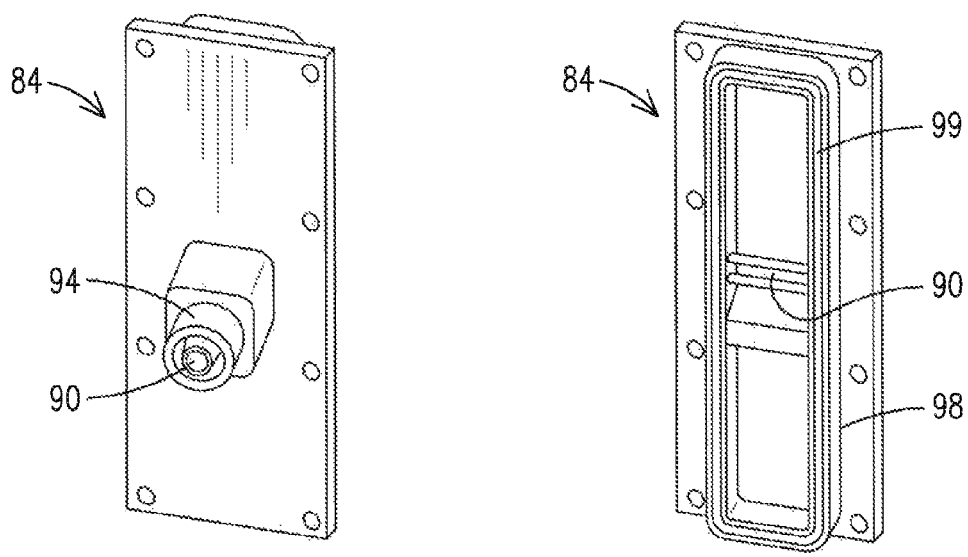
FIGS. 10A and 10B depict perspective views of a front and back of inlet support plate, respectively.
Figure 11A:
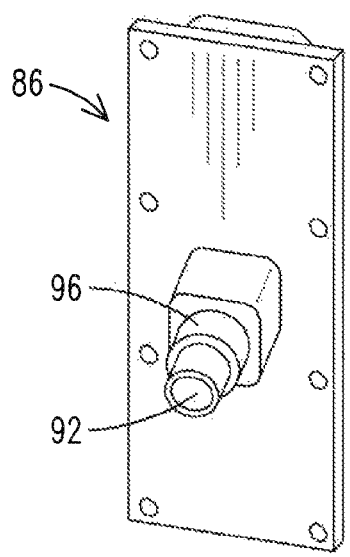
FIGS. 11A and 11B depict perspective views of a front and back of an outlet support plate, respectively.
Figure 11B:
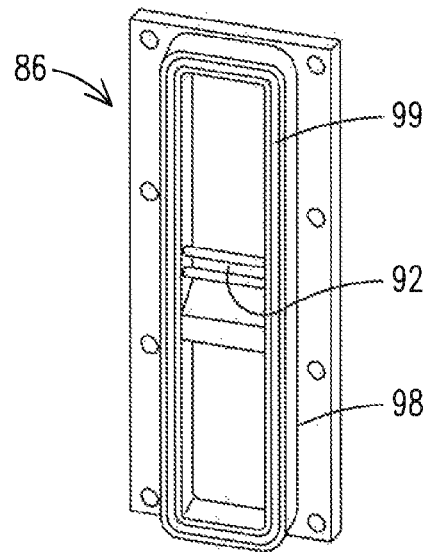

The mounting plate 84 shown in FIG. 10A, includes a coupling 94 for attachment of a fluid inlet line (not shown), and mounting plate 86 of FIG. 11A includes a coupling 96 for attachment of a fluid outlet line (not shown). Both couplings 94, 96 may be configured as quick connect/disconnect to or from fluid lines. As shown in FIGS. 10B and 11B, both plates 84, 86 may include a sealing rim 98 including a seal ring 99 seated in a groove. In a non-limiting example, the sealing rim 98, including the seal ring 99, may abut the face of the second side wall 18 and surround the respective openings 36, 38 to seal the fluid flow paths 24, 28.

In an alternative embodiment in which liquid conduction cooling is implemented, instead of the seal plate 50 mounted on the first end or end wall 16 of the chassis 10, the chassis 10 may include two inlet mounting plates 84 and two outlet mounting plates 86. More specifically, on the second end or second wall 18 two inlet mounting plates 84 may be mounted over the openings 36, 38, and two outlet mounting plates 86 may be mounted over the opening 32, 34 on the first end wall 16. In this manner, a liquid coolant may be injected through the inlet plates 84 on the second end of the chassis 10 into the fluid flow paths 24, 28 and pass through and out of the outlet mounting plates 86 on the first end of the chassis 10. The inlet mounting plates 84 may be mounted on the first end of the chassis 10, and the outlet plates 86 may be mounted on the second end of the chassis so that a liquid coolant flows in an opposite direction as above-described.

In yet another embodiment, the mounting plates 84, 86 may be mounted to the second wall 18 as shown in FIGS. 9A and 9B. On the first end wall 16, an inlet mounting plate 84 may be mounted over the opening 32 of fluid flow path 24 and an outlet mounting plate 86 may be mounted on the first wall 16 over the opening 34 of the second fluid flow path 28. In this manner, a liquid coolant flowing through the first fluid flow path 24 would be travelling in an opposite direction to a liquid coolant flowing through the second fluid flow path 28. In each of these described embodiments having two inlet plates 84 and two outlet plates 86, the first end wall 16 will have a hole pattern around the openings 32, 34 similar to the hole pattern on the second wall 18 for mounting the plates 84, 86.

The above-described electronics chassis 10, including the conduction cooling components, may be used with multiple platforms. In a non-limiting example, organizations that maintain and use fleets of multiple vehicles or multiple fleets of different vehicles, may equip some vehicles for liquid conduction cooling for chassis and others may not be so equipped. If a liquid conduction cooling system were required, the above-described seal plate 50 and mounting plates 84, 86 are quickly installed and linked to a liquid coolant source and pump. Known coolants, such as propylene glycol, may be used wherein the coolant is pumped through system at pressure of up to about 200 p.s.i. If the system must be changed to forced air conduction cooling, the liquid cooling components are simply removed and replaced with the forced air conduction cooling components, including at least the fan assembly 52 and an air filter 46, if one were needed. The organization may maintain an inventory of the conduction cooling components so that the chassis conduction cooling system can be readily and quickly alternated as needed.

While embodiments have been described with reference to various embodiments, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated, but that all embodiments falling within the scope of the appended claims are considered. Moreover, unless specifically stated, any use of the terms first, second, etc., does not denote any order or importance, but rather the terms first, second, etc., are used to distinguish one element from another.

What is claimed is:

1. A housing comprising:
    a frame including two fluid flow paths along two parallel side walls of the frame that is sealed relative to an interior volume of the frame for cooling fluid flow there through for dissipating heat of electrical components mounted within the frame, a first end wall, a second end wall and a base, the base supporting the two parallel side walls, the first end wall and the second end wall;
    a rail assembly supported by the parallel side walls of the frame, the rail assembly configured to support the electrical components to be cooled;

a first opening in a first end wall of the frame, the first opening to a first one of the two fluid flow paths through which a cooling fluid enters or exits the first one of the two fluid flow paths depending on a direction of flow of the cooling fluid;

a second opening in the first end wall of the frame, the second opening to a second one of the two fluid flow paths through which the cooling fluid enters or exits the second one of the two fluid flow paths depending on the direction of the flow of the cooling fluid;

a first array of apertures at the first end wall at the first and second openings of the two fluid flow paths and corresponding to an aperture array of a fan assembly for mounting the fan assembly to the first end wall when the housing is to operate in a forced air conduction cooling mode;

a second array of apertures at the first end wall at the first opening and corresponding to an aperture array of a first fluid control coupling for mounting a first fluid control coupling to the frame when the housing is to operate in a liquid conduction cooling mode; and, a third array of apertures at the first end wall at the second opening and corresponding to an aperture array of a second fluid control coupling for mounting the second fluid control coupling to the frame when the housing is to operate in the liquid conduction cooling mode;

wherein, at the first and second openings in the first end wall of the two fluid flow paths, the frame being indented to interchangeably receive and attach one or more components for forced air conduction cooling to supply air as the cooling fluid when operating in the forced air conduction cooling mode and one or more components for liquid conduction cooling through the fluid flow path to supply liquid coolant as the cooling fluid when operating in the liquid cooling conduction mode.

2. The housing of claim 1, further comprising the one or more components for the forced air conduction cooling; wherein when the housing functions in the forced air conduction cooling mode, the one or more components for the forced air conduction cooling comprises the fan assembly, including at least one fan, mounted at the first or second opening of the fluid flow path to draw air through the two fluid flow paths and the fan assembly.

3. The housing of claim 2, wherein the housing further comprises a filter removably mounted to the second end wall and which receives the cooling fluid flowing through the two fluid flow paths and being opposite the fan assembly to cover a third opening in the second end wall to the first one of the two fluid flow paths and a fourth opening in the second end wall to the second one of the two fluid flow paths, when the housing functions in the forced air conduction cooling mode.

4. The housing of claim 2, wherein when the housing functions in the liquid cooling conduction mode, the housing comprises:

a first fluid control coupling mounted at the first opening for controlling fluid flow of the liquid coolant into and/or out of the first one of the two fluid flow paths; and, a second fluid control coupling mounted at the second opening for controlling fluid flow of the liquid coolant into and/or out of the second one of the two fluid flow paths.

5. The housing of claim 1, further comprising finstock disposed within the two fluid flow paths.

6. The housing of claim 1, further comprising:

a seal plate mounted to the second end wall of the frame opposite the first end wall on which the first and second fluid control couplings are mounted, and the seal plate includes one or more channels providing fluid flow communication between the two fluid flow paths.

7. A modular electronics chassis, comprising:

a frame including a first fluid flow path along a first side wall of the frame and a second fluid flow path along a second side wall of the frame that is parallel to the first side wall, and wherein the first and second fluid flow paths are sealed relative to an interior volume of the frame, the first side wall and the second side wall coupled to a base of the frame;

a first opening to the first fluid flow path at a first end wall of the frame and a second opening to the first fluid flow path at a second end wall of the frame, the first end wall and the second end wall coupled to the base of the frame;

a third opening to the second fluid flow path at the first end wall of the frame and a fourth opening to the second fluid flow path at the second end wall of the frame;

a first array of apertures at the second end wall at the second and fourth openings of the first and second fluid flow paths and corresponding to an aperture array of a fan assembly for mounting the fan assembly to the second end wall when operated in a forced air conduction cooling mode;

a second array of apertures at the first end wall at the first and third openings and corresponding to an aperture array of a first fluid control coupling for mounting a first fluid control coupling to the frame when operated in a liquid conduction cooling mode;

a third array of apertures at the first end wall at the second opening and corresponding to an aperture array of a second fluid control coupling for mounting the second fluid control coupling to the frame when the housing is to operate in the liquid conduction cooling mode; and, a fourth array of apertures at the first end wall at the fourth opening and corresponding to an aperture array of a third fluid control coupling for mounting the third fluid control coupling to the frame when the housing is to operate in the liquid conduction cooling mode;

wherein the first and second end walls of the frame interchangeably receive and attach components for forced air conduction cooling to circulate air as a cooling fluid in the first and second fluid flow paths when operating in the forced air conduction cooling mode, and components for liquid conduction cooling to circulate liquid coolant as the cooling fluid through the first and second fluid flow paths when operating in the liquid cooling conduction mode.

8. The modular electronics chassis of claim 7, wherein the frame being indented at the second end wall between the base and a top rim of the frame which from an indentation to receive the components for the forced air conduction cooling and when the chassis functions in the forced air conduction cooling mode, the chassis further comprises the fan assembly, including at least one fan, removably mounted to the second end wall to draw air through the first and second fluid flow paths and the fan assembly.

9. The modular electronics chassis of claim 8, wherein the chassis further includes a filter removably mounted to the first end wall to cover the first and third openings when the chassis functions in the forced air conduction cooling mode wherein the air enters the frame through the second end wall, exits the first end wall through the first opening or the third opening, is filtered by the filter and returned to the frame through the first opening or the third opening.

10. The modular electronics chassis of claim 7, wherein when the chassis functions in the liquid cooling conduction mode, the chassis comprises:

a first fluid control coupling removably mounted to the first end wall of the frame for controlling fluid flow of the liquid coolant from the first fluid flow path to the second fluid flow path;

a second fluid control coupling removably mounted to the second end wall for controlling fluid flow of the liquid coolant into and/or out of the first fluid flow path; and, a third fluid control coupling removably mounted to the second end wall for controlling fluid flow of the liquid coolant into and/or out of the second fluid flow path wherein the liquid coolant enters the frame through the second end wall, exits the first end wall through the first opening or the third opening, and is communicated and returned to the frame through the first opening or the third opening.

11. The modular electronics chassis of claim 10, wherein the first fluid control coupling removably mounted to the first end wall of the frame includes a seal plate having one or more fluid flow channels providing fluid flow communication between the first and second fluid flow paths.

12. The modular electronics chassis of claim 7, further comprising a rail assembly for receiving one or more circuit board modules, wherein the rail assembly includes a first rail member along the first side wall and spaced apart from the first side wall forming the first fluid flow path between the first side wall and first rail member, and a second rail member along the second side wall and spaced from the second side wall forming the second fluid flow path between the second side wall and second rail member.

13. A kit for a modular electronics chassis, comprising:
a frame including two fluid flow paths each comprising finstock along two parallel side walls of the frame that is sealed relative to an interior volume of the frame for cooling fluid flow there through for dissipating heat of electronic circuit modules removably mounted within the frame, a first end wall, a second end wall and a base, the base supporting the two parallel side walls, the first end wall and the second end wall wherein the second end wall of the frame being indented between a top rim and the base of the frame;

forced air mode components removably attached to the first end wall and the second end wall to communicate air through the two fluid paths of the frame, in a forced air conduction cooling mode of the chassis;

liquid cooling mode components removably attached to the first end wall and the second end wall to communicate liquid coolant through the two fluid paths of the frame, in a liquid conduction cooling mode of the chassis;

a first array of apertures at the first end wall at first and second openings of the two fluid flow paths and corresponding to an aperture array of a fan assembly for mounting the fan assembly to the first end wall when the chassis is to operate in the forced air conduction cooling mode;

a second array of apertures at the first end wall at the first opening and corresponding to an aperture array of a first fluid control coupling for mounting a first fluid control coupling to the frame when the housing is to operate in the liquid conduction cooling mode; and, a third array of apertures at the first end wall at the second opening and corresponding to an aperture array of a second fluid control coupling for mounting the second fluid control coupling to the frame when the housing is to operate in the liquid conduction cooling mode.

14. The kit of claim 13, wherein the forced air mode components comprising the fan assembly removably mounted to the second end wall being indented in the frame and a filter removably mountable on the first end wall of the frame wherein the air enters the frame through the second end wall, exits the first end wall through an opening of at least one of the two fluid flow paths, is filtered by the filter and returned to the frame through another opening of the two fluid flow paths.

15. The kit of claim of claim 14, wherein liquid cooling mode components comprises:
the first fluid control coupling removably mounted to the first end wall of the frame for controlling fluid flow of the liquid coolant from a first one of the two fluid flow paths to a second one of the two fluid flow paths;

the second fluid control coupling removably mounted to the second end wall at the first opening for controlling the fluid flow of the liquid coolant into and/or out of the first one of the fluid flow paths; and, a third fluid control coupling removably mounted to the second end wall at the second opening for controlling the fluid flow of the liquid coolant into and/or out of the second one of the fluid flow paths.

* * * * *